(12) United States Patent  
Lu

(10) Patent No.: US 7,498,806 B2
(45) Date of Patent: Mar. 3, 2009

(54) APPARATUS AND METHOD FOR ISOLATING NOISE FROM A SIGNAL

(75) Inventor: Qixiang Lu, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 802 days.

(21) Appl. No.: 11/155,686

(22) Filed: Jun. 20, 2005

(65) Prior Publication Data

US 2006/0284667 A1    Dec. 21, 2006

(51) Int. Cl.
*G01V 3/00* (2006.01)

(52) U.S. Cl. ...................... 324/300; 324/322

(58) Field of Classification Search ......... 324/300–322; 600/407–422, 532; 606/32, 41; 607/101, 607/122; 364/557; 327/379
See application file for complete search history.

(56) References Cited

U.S. PATENT DOCUMENTS

| | | | |
|---|---|---|---|
| 5,519,644 A * | 5/1996 | Benton | 702/88 |
| 5,541,840 A | 7/1996 | Gurne et al. | |
| 5,689,517 A | 11/1997 | Ruparel | |
| 6,009,363 A | 12/1999 | Beckert et al. | |
| 6,026,461 A | 2/2000 | Baxter et al. | |
| 6,175,789 B1 | 1/2001 | Beckert et al. | |
| 6,181,992 B1 | 1/2001 | Gurne et al. | |
| 6,226,305 B1 | 5/2001 | McLoughlin et al. | |
| 6,292,931 B1 | 9/2001 | Dupenloup | |
| 6,480,723 B1 | 11/2002 | Davidson et al. | |
| 6,553,039 B1 | 4/2003 | Huber et al. | |
| 6,634,896 B1 | 10/2003 | Potega | |
| 6,647,027 B1 | 11/2003 | Gasparik et al. | |
| 6,687,263 B2 | 2/2004 | van Oldenborgh et al. | |
| 6,704,829 B1 | 3/2004 | Hoshi et al. | |
| 6,738,696 B2 | 5/2004 | Oi | |

OTHER PUBLICATIONS

"High-Speed CMOS Logic 16-Channel Analog Multiplexer/Demultiplexer(CD74HC4067, CD74HCT4067)", Texas Instruments, Feb. 1998- Revised Jul. 2003, pp. 1-13.
"Improved, 8-Channel/Dual 4-Channel, CMOS Analog Multiplexers (DG408/DG409)", Maxim Integrated Products, 19-4725; Rev. 3; Aug. 2002, pp. 1-12.
"Single 8-Channel Analog Multiplexer/Demultiplexer * Dual 4-Channel Analog Multiplexer/Demultiplexer * Triple 2-Channel Analog Multiplexer/Demultiplexer (CD4051BC*CD4052BC*CD4053BC)", Fairchild Semiconductor Corporation, Nov. 1983—Revised Aug. 2000, pp. 1-13.
"CMOS Analog Multiplexers/Demultiplexers (CD4067BMS, CD4097BMS)", Intersil Corporation, Dec. 1992, pp. 7-1-7-9 plus 1 page.
"CMOS Analog Multiplexers/Demultiplexers (CD4051BMS, CD4052BMS, CD4053BMS)", Intersil Corporation, Dec. 1992, pp. 7-937-7-947 and 948.

* cited by examiner

*Primary Examiner*—Brij B Shrivastav
(74) *Attorney, Agent, or Firm*—Baker & Hostetler LLP

(57) ABSTRACT

A circuit is provided for isolating noise from an input signal to an Analog/Digital (A/D) converter. The circuit includes a plurality of multiplexers and a capacitor connected between the poles of two Single-Pole Multi-Throw (SPMT) multiplexers. A method is also provided for isolating noise from an input signal to the A/D converter using the circuit. The method includes storing a charge in the capacitor and discharging the charge to an A/D converter used to control a system or device.

20 Claims, 3 Drawing Sheets

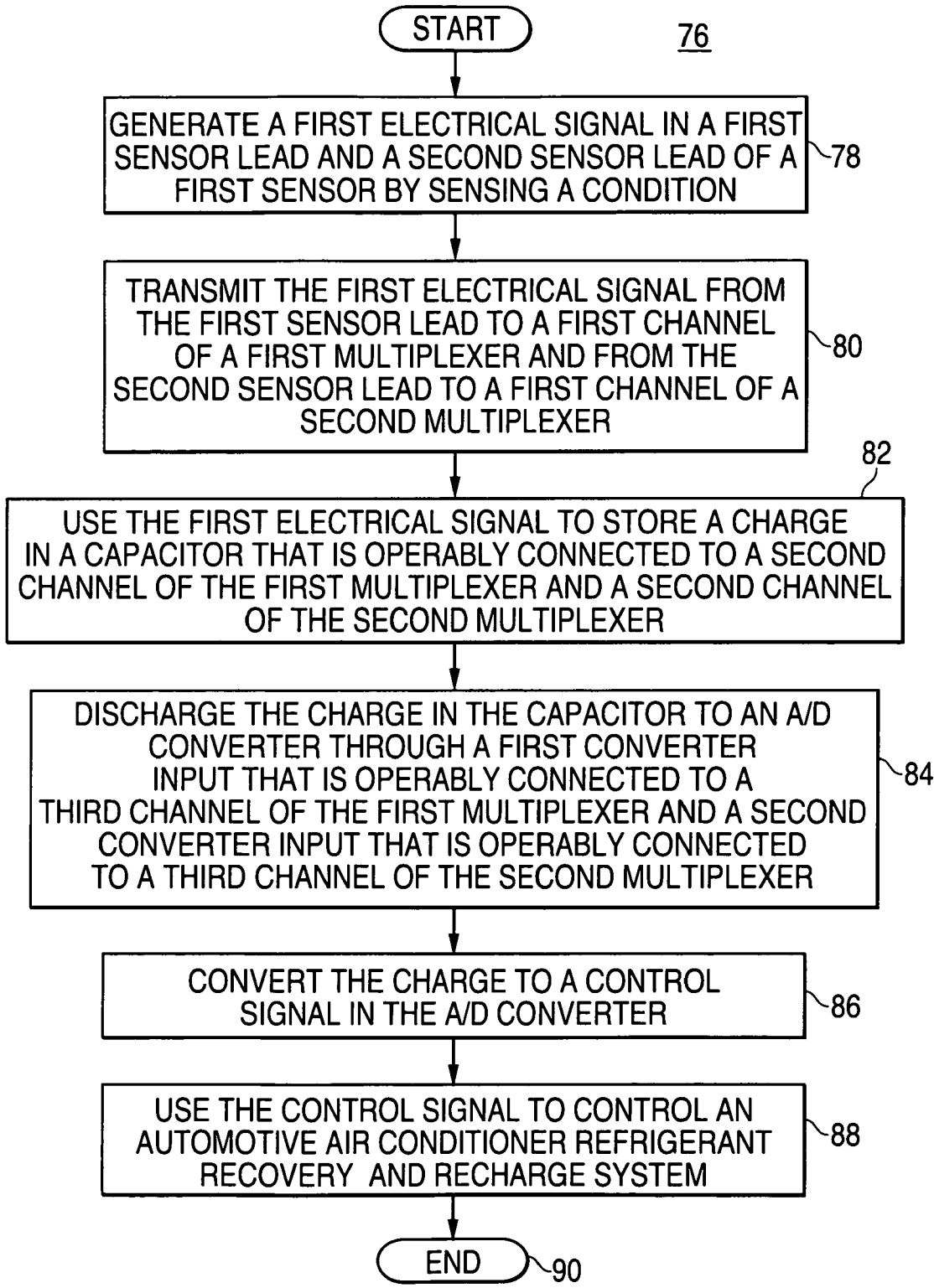

APPARATUS AND METHOD FOR ISOLATING NOISE FROM A SIGNAL

FIELD OF THE INVENTION

The present invention relates generally to devices and methods that may be used to reduce the noise in electronic signals. More particularly, the present invention relates to devices and methods that may be used to reduce signal noise of input signals to Analog/Digital (A/D) converters.

BACKGROUND OF THE INVENTION

Sensors (e.g., thermocouples, strain gauges, and transducers) typically emit analog electronic signals that are subsequently converted to digital signals using an A/D converter. Unfortunately, analog electronic signals are susceptible to picking up electronic noise as they travel from the sensors to the A/D converter. Therefore, electronic circuits have been developed to minimize the amount of noise in these analog signals.

Typically, the electronic circuits that have been developed include a relatively large number of components. For example, some such circuits make use of two single-pole double-throw (SPDT) switches for every sensor that sends an input signal to an A/D converter. As such, when numerous sensors are electrically connected to the same A/D converter, the total number of switches that must be included in the circuit connecting the sensors and the A/D converter can become prohibitively large.

Among the disadvantages of including many components in a circuit between sensors and an A/D is that, with each additional component, the probability that at least one of the components will break down and cause a malfunction in the circuit increases. Also, additional components increase the size of the circuit and require the use of additional circuit board area, which may not be available if the circuit is included in a relatively small device.

At least in view of the above, it would be desirable to reduce the amount of signal noise that is generated between a plurality of sensors and an A/D converter using smaller, more reliable and more efficient circuitry than prior art circuit.

SUMMARY OF THE INVENTION

The foregoing needs are met, to a great extent, by the present invention wherein, in one embodiment thereof, a circuit is provided. The circuit includes a first multiplexer and a second multiplexer. The circuit also includes a capacitor operably connected to a pole of the first multiplexer and a pole of the second multiplexer. The circuit further includes a sensor having a first sensor lead and a second sensor lead, wherein the first sensor lead is operably connected to a first channel of the first multiplexer and the second sensor lead is operably connected to a first channel of the second multiplexer. In addition, the circuit includes an Analog/Digital (A/D) converter having a first converter lead and a second converter lead, wherein the first converter lead is operably connected to a second channel of the first multiplexer and the second converter lead is operably connected to a second channel of the second multiplexer.

According to another embodiment of the present invention, a method of isolating noise from an input signal to an Analog/Digital (A/D) converter is provided. The method includes generating a first electrical signal in a first sensor lead and a second sensor lead of a first sensor by sensing a condition. The method also includes transmitting the first electrical signal from the first sensor lead to a first channel of a first multiplexer and from the second sensor lead to a first channel of a second multiplexer. The method further includes using the first electrical signal to store a charge in a capacitor that is operably connected to a pole of the first multiplexer and a pole of the second multiplexer. In addition, the method includes discharging the charge in the capacitor to an A/D converter through a first converter lead that is operably connected to a second channel of the first multiplexer and a second converter lead that is operably connected to a second channel of the second multiplexer.

According to yet another embodiment of the present invention, a circuit is provided. The circuit includes first generating means for generating a first electrical signal by sensing a first condition. The circuit also includes first transmitting means for transmitting the first electrical signal from the first generating means to a first channel of a first multiplexer and to a first channel of a second multiplexer. The circuit further includes storing means for storing a charge using the first electrical signal, wherein the storing means is operably connected to a pole of the first multiplexer and a pole of the second multiplexer. In addition, the circuit includes discharging means for discharging the charge in the storing means to an A/D converter through a first converter lead that is operably connected to a second channel of the first multiplexer and a second converter lead that is operably connected to a second channel of the second multiplexer.

According to still another embodiment of the present invention, a circuit is provided. The circuit includes a first Single-Pole Multi-Throw (SPMT) multiplexer including a first throw and a second throw. The circuit also includes a second SPMT multiplexer including a third throw and a fourth throw. The circuit further includes a capacitor operably connected to a pole of the first multiplexer and a pole of the second multiplexer. In addition, the circuit includes a sensor having a first sensor lead and a second sensor lead, wherein the first sensor lead is operably connected to a first channel of the first multiplexer and the second sensor lead is operably connected to a first channel of the second multiplexer. Further, the circuit includes an Analog/Digital (A/D) converter having a first converter lead and a second converter lead, wherein the first converter lead is operably connected to a second channel of the first multiplexer and the second converter lead is operably connected to a second channel of the second multiplexer.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

FIG. 3 is flowchart illustrating steps that may be followed in accordance with a method or a process of isolating noise from an input signal to an A/D converter according to yet another embodiment of the present invention.

DETAILED DESCRIPTION

Figure 1:
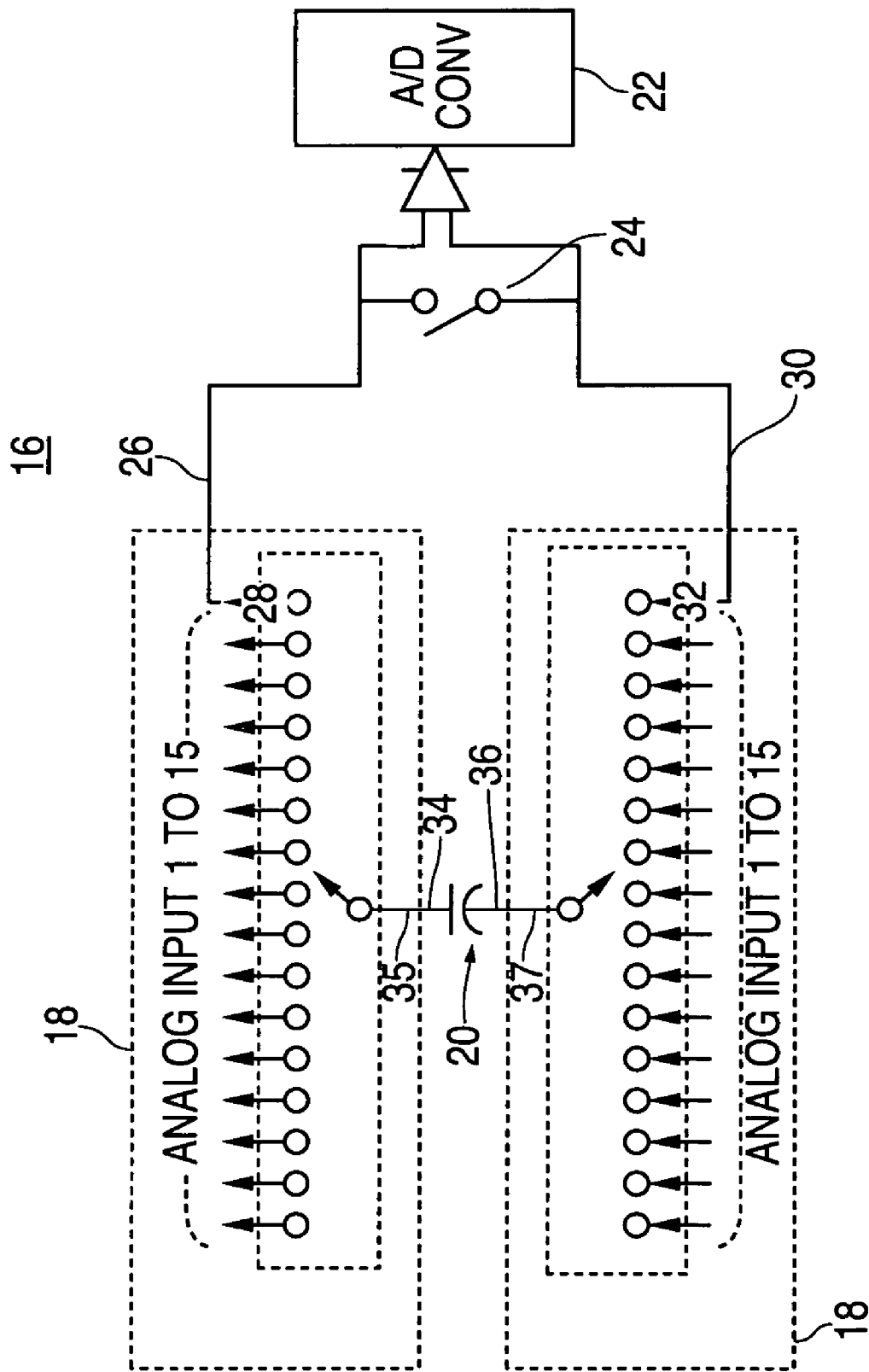
FIG. 1 is a block diagram of a noise-reducing circuit according to one embodiment of the present invention.

At least in view of the above-discussed shortcomings of the prior art, novel devices, systems and methods have been developed to isolate signal noise from an input signal to an A/D converter. The present invention will now be described with reference to the drawing figures, in which like reference numerals refer to like parts throughout.

FIG. 1 is a block diagram of a noise-reducing circuit 16 according to one embodiment of the present invention. The circuit 16 includes two multiplexers 18, a capacitor 20, an A/D converter 22 and a switch 24. According to certain embodiments of the present invention, each multiplexer 18 includes at least one pole (i.e., a contact that is always actively connected to a circuit) and a plurality of throws (i.e., contacts that may be connected to a pole). Therefore, each multiplexer 18 may be a Single-Pole Multi-Throw (SPMT) switch, where "multi" indicates that two, three or more throws are included in the multiplexer. Also, according to certain embodiments, two or more multiplexers 18 are present on a single chip (e.g., CD 4052 and CD 4053 chips).

As illustrated in FIG. 1, one lead 26 from one side of the switch 24 is operably connected to a channel 28 of one multiplexer 18 and a lead 30 from the other side of the switch 24 is operably connected to a channel 32 of the other multiplexer 18. Also, a lead 34 from one side of the capacitor 20 is operably connected to a pole 35 of one multiplexer 18 and a lead 36 from the other side of the capacitor 20 is operably connected to a pole 37 of the other multiplexer 18.

Figure 2:
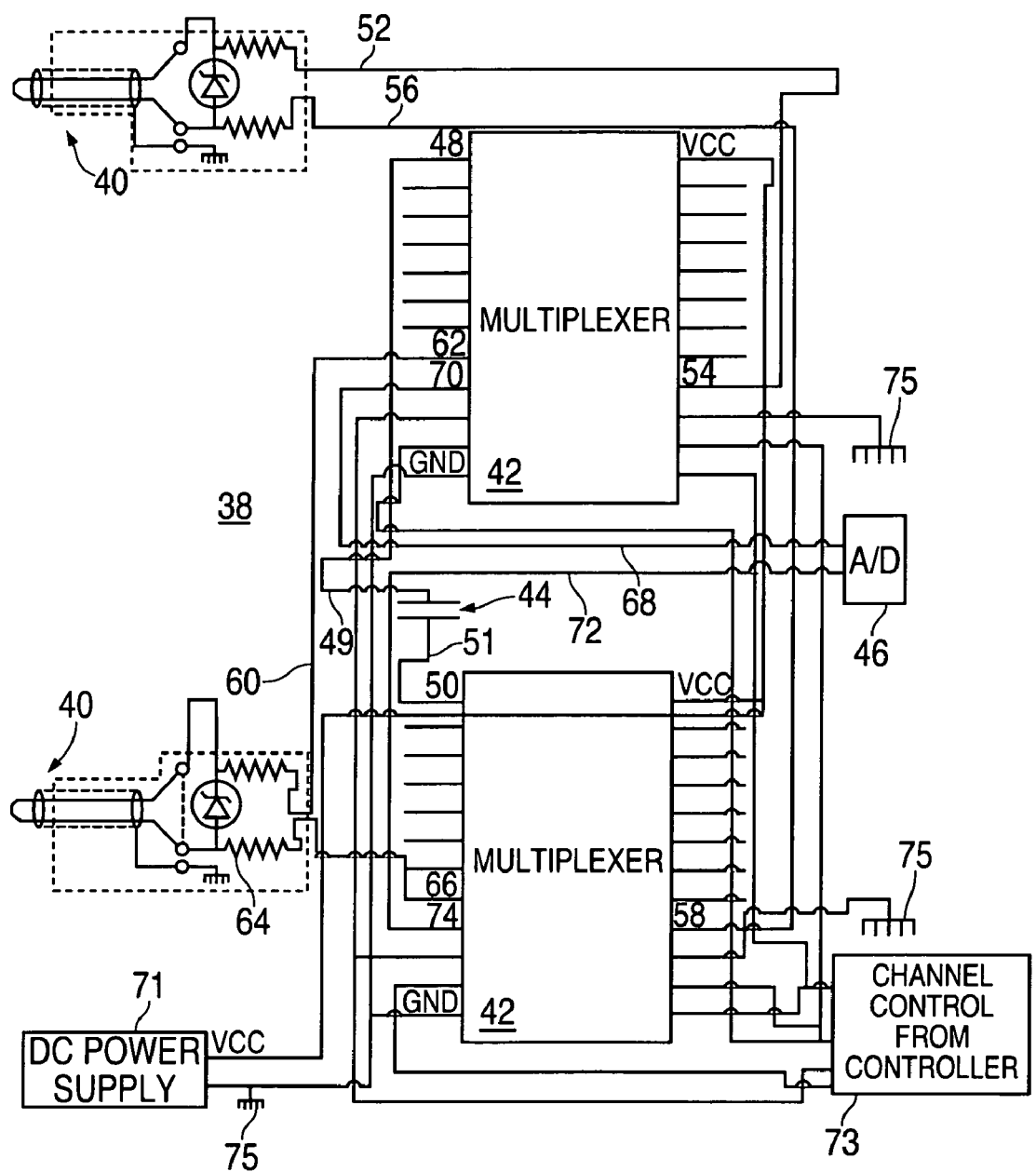
FIG. 2 is a circuit diagram of a noise-reducing circuit according to another embodiment of the present invention.

FIG. 2 is a circuit diagram of a noise-reducing circuit 38 according to another embodiment of the present invention. As illustrated in FIG. 2, the circuit 38 includes two sensors 40, two multiplexers 42, a capacitor 44 and an A/D converter 46. As also illustrated in FIG. 2, the capacitor 44 is operably connected to a pole 48 of the multiplexer 42 illustrated in the upper portion of FIG. 2 via a first lead 49 and a pole 50 of the second multiplexer 42 illustrated in the lower portion of FIG. 2 via a second lead 51.

As further illustrated in FIG. 2, one or both of the multiplexers 42 may be chosen to include at least 4 channels. However, other embodiments of the present invention allow for using multiplexers with less than 4 channels.

Also illustrated in FIG. 2 as being included in the circuit 38 are a DC power supply 71, a channel control 73 and a plurality of grounds 75. However, alternate and/or additional elements that can assist in the operation of the circuit 38 may be included.

In addition, the sensor 40 illustrated at the top of FIG. 2 has a first sensor lead 52 that is operably connected to a second channel 54 of the upper multiplexer 42 and a second sensor lead 56 that is operably connected to a second channel 58 of the lower multiplexer 42. The sensor 40 illustrated at the bottom of FIG. 2 has a first sensor lead 60 that is operably connected to a third channel 62 of the upper multiplexer 42 and a second sensor lead 64 that is operably connected to a third channel 66 of the lower multiplexer 42.

Also, the A/D converter 46 has a first converter lead 68 that is operably connected to a fourth channel 70 of the upper multiplexer 42 and a second converter lead 72 that is operably connected to a fourth channel 74 of the lower multiplexer 42.

According to certain embodiments of the present invention, the multiplexers 42 are chosen to be analog multiplexers that can receive analog signals from sensors 40 that are operably connected thereto. For example, CD74HC4067 and CD74HCT4067 multiplexers from TEXAS INSTRUMENTS may be used, as may DG409/DG409 multiplexers from MAXIM, CD4051BC multiplexers from JAMECO ELECTRONICS, CD4067BMS, CD4097BMS, CD4051BMS, CD4052BMS and CD4053BMS multiplexers from INTERSIL, However, this is not particularly limiting of the present invention and other types of multiplexers, including those that can accommodate digital signals, may also be used. It should also be noted that, although the multiplexers 42 illustrated in FIG. 2 are substantially identical to each other, the use of non-identical multiplexers 42 in circuit 38 is also within the scope of certain embodiments of the present invention.

No particular limitations are placed on the types of sensors 40 that may be used in the circuit 38. As such, the sensors 40 may be configured to sense any variable that is of concern to a user. For example, a sensor 40 may take the form of a thermocouple, a strain gauge or a low voltage transducer.

The circuit 38 may be included in any device that would benefit from having sensors included therein. However, according to certain embodiments of the present invention, the circuit 38 is configured to be incorporated in an automotive air conditioner refrigerant recovery and recharge system.

No particular limits are placed on the number of sensors that may be used in circuits according to the present invention. However, certain embodiments of the present invention make use of sixteen-channel multiplexers. In those embodiments, the capacitor is operably connected to the poles of each multiplexer and the A/D converter uses one channel in each multiplexer. Therefore, only fifteen slots remain to accommodate sensors.

According to other embodiments of the present invention, a circuit that includes first generating means for generating an electrical signal in a first sensor lead and a second sensors lead of a sensors by sensing a condition is provided. In such embodiments, a sensor may be used as the first generating means.

Also provided in the circuit is first transmitting means for transmitting the electrical signal from the first generating means to a first channel of a first multiplexer and to a first channel of a second multiplexer. The first transmitting means may take the form, for example, of the leads 52, 56, 60, 64 connected between the sensors 40 and the multiplexers 42 in FIG. 2.

The circuit also typically includes storing means for using the electrical signal to store a charge in a capacitor that is operably connected to a pole of the first multiplexer and a pole of the second multiplexer. Such storing means may take the form, for example, of the capacitor 44 in FIG. 2.

The circuit further commonly includes discharging means for discharging the charge in the storing means to an A/D converter through a first converter input that is operably connected to a second channel of the first multiplexer and a second converter input that is operably connected to a second channel of the second multiplexer. The discharging means may take the form, for example, of the leads 49, 51 connected between the capacitor 44 and the multiplexers 42 in FIG. 2. According to certain embodiments of the present invention, the first generating means may include one or more of a strain gauge, a low voltage transducer or some other type of sensor.

The above-discussed circuit also may include converting means for converting the charge to a control signal. According to certain embodiments of the present invention, the converting means may take the form of a A/D converter. The circuit may also include controlling means for using the control signal to control an automotive air-conditioner refrigerant recovery and recharge system. However, the controlling means may also be used to control other devices according to the present invention.

Other components that may be included in the above-discussed circuit include second generating means for generating a second electrical signal by sensing a second condition. Such second generating means may take the form, for example, of a second sensor or of a second type of sensor. The circuit may also include second transmitting means for transmitting the second electrical signal to a third channel of the first multiplexer and a third channel of the second multiplexer. Such second transmitting means may take the form of leads from a second sensor.

As will be appreciated by one of skill in the art, while sensing a particular condition, a sensor 40 emits a signal that fluctuates over time as a function of the parameter that the sensor 40 is sensing fluctuates and as a function of any signal noise that is inherent to any non-ideal system. According to certain embodiments, of the present invention, the fluctuating signal emitted by the sensor 40 is used to charge the capacitor 44. Then, the charge in the capacitor 44 is discharged to the A/D converter 46. Since the discharge from the capacitor 44 is largely a DC-type current (i.e., a substantially non-fluctuating signal), capacitor 44 effectively averages out and/or reduces signal noise relative to signals emitted directly from the sensor 40.

FIG. 3 is a flowchart 76 that more particularly illustrates steps that may be followed in accordance with a method or a process of isolating noise from an input signal to an A/D converter according to yet another embodiment of the present invention. Step 78 of flowchart 76 specifies generating a first electrical signal in a first sensor lead and a second sensor lead of a first sensor by sensing a condition. Step 78 may be implemented, for example, by utilizing a strain gauge as the first sensor or by utilizing a low voltage transducer as the first sensor. In addition, generating step 78 can include providing an excitation force of at least 5 volts to the first sensor and/or the second sensor.

Step 80 of flowchart 76 specifies transmitting the first electrical signal from the first sensor lead to a first channel of a first multiplexer and from the second sensor lead to a first channel of a second multiplexer.

Following step 80, step 82 specifies using the first electrical signal to store a charge in a capacitor that is operably connected to a pole of the first multiplexer and a pole of the second multiplexer. Step 84 then specifies discharging the charge in the capacitor to an A/D converter through a first converter input that is operably connected to a second channel of the first multiplexer and a second converter input that is operably connected to a second channel of the second multiplexer.

Step 86 next specifies converting the charge to a control signal in the A/D converter. Then, step 88 specifies using the control signal to control, for example, an automotive air conditioner refrigerant recovery and recharge system. However, according to other embodiments of the present invention, alternate devices and systems may be controlled. Flowchart 76 then ends at step 90.

According to other embodiments of the present invention, a second electrical signal may be generated in a third sensor lead and a fourth sensor lead of a second sensor by sensing a condition. As such, the generation of this second electrical signal typically applies when at least two sensors are included in a circuit according to the present invention. It should also be noted that, according to certain embodiments of the present invention, many electrical signals may be generated by a large number of sensors.

Following the above step, the second electrical signal may be transmitted from the third sensor lead to a third channel of the first multiplexer and from the fourth sensor lead to a third channel of the second multiplexer. If two or more sensors are included, additional electrical signals may also be transmitted to the multiplexers according to the present invention. These signals may all be converted to digital signals through the A/D converter and may be used to control any of a number of devices.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A circuit, comprising:
    a first multiplexer and a second multiplexer;
    a capacitor operably connected to a pole of the first multiplexer and a pole of the second multiplexer;
    a sensor having a first sensor lead and a second sensor lead, wherein the first sensor lead is operably connected to a first channel of the first multiplexer and the second sensor lead is operably connected to a first channel of the second multiplexer; and
    an Analog/Digital (A/D) converter having a first converter lead and a second converter lead, wherein the first converter lead is operably connected to a second channel of the first multiplexer and the second converter lead is operably connected to a second channel of the second multiplexer.

2. The circuit of claim 1, wherein the first multiplexer comprises a Single-Pole Multi-Throw (SPMT) multiplexer and wherein the SPMT comprises at least 2 throws.

3. The circuit of claim 1, wherein the circuit is configured to be incorporated in an automotive air conditioner refrigerant recovery and recharge system.

4. The circuit of claim 1, wherein the first multiplexer and the second multiplexer are substantially identical.

5. The circuit of claim 1, wherein the sensor comprises at least one of a strain gauge or a thermocouple.

6. The circuit of claim 1, wherein the sensor comprises a low voltage transducer.

7. The circuit of claim 1, wherein the first multiplexer comprises at least 4 channels.

8. A method of isolating noise from an input signal to an Analog/Digital (A/D) converter, the method comprising:
    generating a first electrical signal in a first sensor lead and a second sensor lead of a first sensor by sensing a condition;

transmitting the first electrical signal from the first sensor lead to a first channel of a first multiplexer and from the second sensor lead to a first channel of a second multiplexer;

using the first electrical signal to store a charge in a capacitor that is operably connected to a pole of the first multiplexer and a pole of the second multiplexer; and discharging the charge in the capacitor to an A/D converter through a first converter lead that is operably connected to a second channel of the first multiplexer and a second converter lead that is operably connected to a second channel of the second multiplexer.

9. The method of claim 8, wherein the generating step comprises utilizing a strain gauge as the first sensor.

10. The method of claim 8, wherein the generating step comprises utilizing a low voltage transducer as the first sensor.

11. The method of claim 8, further comprising:
converting the charge to a control signal in the A/D converter; and
using the control signal to control an automotive air conditioner refrigerant recovery and recharge system.

12. The method of claim 8, further comprising:
generating a second electrical signal in a third sensor lead and a fourth sensor lead of a second sensor by sensing a condition; and
transmitting the second electrical signal from the third sensor lead to a third channel of the first multiplexer and from the fourth sensor lead to a third channel of the second multiplexer 13. The method of claim 8, wherein the generating step comprises providing an excitation force of at least 5 volts to the first sensor.

14. A circuit, comprising:
first generating means for generating a first electrical signal by sensing a first condition;
first transmitting means for transmitting the first electrical signal from the first generating means to a first channel of a first multiplexer and to a first channel of a second multiplexer;
storing means for storing a charge using the first electrical signal, wherein the storing means is operably connected to a pole of the first multiplexer and a pole of the second multiplexer; and
discharging means for discharging the charge in the storing means to an A/D converter through a first converter lead that is operably connected to a second channel of the first multiplexer and a second converter lead that is operably connected to a second channel of the second multiplexer.

15. The circuit of claim 14, wherein the first generating means comprises a strain gauge.

16. The circuit of claim 14, wherein the first generating means comprises a low voltage transducer.

17. The circuit of claim 14, further comprising:
converting means for converting the charge to a control signal in the A/D converter; and
controlling means for using the control signal to control an automotive air conditioner refrigerant recovery and recharge system.

18. The circuit of claim 14, further comprising:
second generating means for generating a second electrical signal by sensing a condition; and
second transmitting means for transmitting the second electrical signal to a third channel of the first multiplexer and to a third channel of the second multiplexer.

19. A circuit, comprising:
a first Single-Pole Multi-Throw (SPMT) multiplexer including a first throw and a second throw;
a second SPMT multiplexer including a third throw and a fourth throw;
a capacitor operably connected to a pole of the first multiplexer and a pole of the second multiplexer;
a sensor having a first sensor lead and a second sensor lead, wherein the first sensor lead is operably connected to a first channel of the first multiplexer and the second sensor lead is operably connected to a first channel of the second multiplexer; and
an Analog/Digital (A/D) converter having a first converter lead and a second converter lead, wherein the first converter lead is operably connected to a second channel of the first multiplexer and the second converter lead is operably connected to a second channel of the second multiplexer.

20. The circuit of claim 19, wherein the sensor comprises at least one of a strain gauge, a thermocouple or a low voltage transducer.

* * * * *